United States Patent
Rea et al.

(10) Patent No.: US 11,541,901 B2
(45) Date of Patent: Jan. 3, 2023

(54) OPENING SWITCH FOR A VEHICLE

(71) Applicant: Faurecia Interior Systems, Inc., Auburn Hills, MI (US)

(72) Inventors: Julien Rea, Sunnyvale, CA (US); John Marsh, San Jose, CA (US); Gaurav Agarwal, Pune (IN); Cedric Ketels, Mountain View, CA (US); Michael Twork, Clarkston, MI (US); Christophe Brunard, Bois-Colombes (FR)

(73) Assignee: Faurecia Interior Systems, Inc., Auburn Hills, MI (US)

( * ) Notice: Subject to any disclaimer, the term of this patent is extended or adjusted under 35 U.S.C. 154(b) by 167 days.

(21) Appl. No.: 16/663,725

(22) Filed: Oct. 25, 2019

(65) Prior Publication Data

US 2021/0122390 A1   Apr. 29, 2021

(51) Int. Cl.
*B60W 50/16* (2020.01)
*G06F 3/044* (2006.01)
(Continued)

(52) U.S. Cl.
CPC ............. *B60W 50/16* (2013.01); *E05B 81/77* (2013.01); *G06F 3/0414* (2013.01); *G06F 3/0448* (2019.05); *E05B 2047/0054* (2013.01)

(58) Field of Classification Search
CPC .... B60W 50/16; G06F 3/0448; G06F 3/0414; G06F 3/044; G06F 3/041; E05B 81/77;
(Continued)

(56) References Cited

U.S. PATENT DOCUMENTS 1,007,342 A   10/1911   Ecker
8,327,715 B2  12/2012   Bradley et al.
(Continued)

FOREIGN PATENT DOCUMENTS

AU   2018203722 A1   6/2018
CN   207439577 U     6/2018
(Continued)

OTHER PUBLICATIONS

European Search Report corresponding to European Application No. EP 20 20 0600, dated Mar. 22, 2021, 7 pages.

*Primary Examiner* — Lheiren Mae A Caroc
(74) *Attorney, Agent, or Firm* — Reising Ethington P.C.

(57) ABSTRACT

An opening switch for a vehicle having a decorative cover assembly, a sensor housing region, and a microelectromechanical (MEMS) sensor mounted in the sensor housing region. The decorative cover assembly has an inner surface, an outer surface, an anchor portion, and a deflection portion. When contact from a vehicle user occurs at the deflection portion in the decorative cover assembly, a microdeflection occurs. The microdeflection has a microdeflection apex, and the microdeflection apex is spaced from other surfaces in the sensor housing region when the contact from the user occurs at the deflection portion in the decorative cover assembly. The MEMS sensor is configured to generate an output signal that is indicative of a force of the contact from the user. The force integrated switch can include haptic feedback and/or backlighting.

14 Claims, 4 Drawing Sheets

(51) Int. Cl.
*E05B 81/76* (2014.01)
*G06F 3/041* (2006.01)
*E05B 47/00* (2006.01)

(58) Field of Classification Search
CPC .. E05B 2047/0054; E05B 81/76; E05B 47/00; H03K 17/965; B60K 2370/143; B60K 2370/128; B60K 2370/131; B60K 2370/774; B60K 2370/794; B60K 2370/797; B60K 37/06; B60K 35/00; H01H 2036/0093
USPC ........................................................ 200/181
See application file for complete search history.

(56) References Cited

U.S. PATENT DOCUMENTS

| | | | |
|---|---|---|---|
| 8,994,689 B2 | 3/2015 | Pandher et al. | |
| 9,111,669 B2 | 8/2015 | Auberger et al. | |
| 9,576,446 B2 | 2/2017 | Zellers | |
| 9,690,412 B2 | 6/2017 | Tissot | |
| 9,715,280 B2 | 7/2017 | Ullrich et al. | |
| 9,841,850 B2 | 12/2017 | Schediwy et al. | |
| 10,067,567 B2 * | 9/2018 | Andrews | G06F 3/03547 |
| 10,078,024 B2 | 9/2018 | Esteves et al. | |
| 10,126,183 B2 | 11/2018 | Campbell et al. | |
| 10,180,723 B2 | 1/2019 | Lisseman et al. | |
| 10,466,826 B2 * | 11/2019 | Andrews | B60K 37/00 |
| 10,817,061 B2 * | 10/2020 | Andrews | G06F 3/016 |
| 2009/0002328 A1 | 1/2009 | Ullrich et al. | |
| 2009/0065267 A1 | 3/2009 | Sato | |
| 2016/0195932 A1 | 7/2016 | Czelnik et al. | |
| 2016/0209441 A1 | 7/2016 | Mazzeo et al. | |
| 2016/0342229 A1 | 11/2016 | Andrews et al. | |
| 2019/0006962 A1 | 3/2019 | Lu et al. | |
| 2019/0101989 A1 | 4/2019 | Andrews et al. | |
| 2019/0204920 A1 * | 7/2019 | Lisseman | B62D 1/04 |
| 2020/0089358 A1 * | 3/2020 | Andrews | G06F 3/04144 |

FOREIGN PATENT DOCUMENTS

| | | |
|---|---|---|
| DE | 102010026910 A1 | 8/2011 |
| DE | 102014018458 B3 | 12/2015 |
| DE | 102015010355 B3 | 7/2016 |
| DE | 102015200038 A1 | 7/2016 |
| DE | 112018000308 T5 | 9/2019 |
| EP | 2037349 A2 | 3/2009 |
| FR | 2963838 A1 | 2/2012 |
| FR | 2978846 A1 | 2/2013 |
| JP | 2017126505 A | 7/2017 |
| WO | 2017206769 A1 | 12/2017 |
| WO | WO2019004930 A1 | 1/2019 |
| WO | WO2019051189 A1 | 3/2019 |

* cited by examiner

OPENING SWITCH FOR A VEHICLE

TECHNICAL FIELD

The present disclosure is related generally to opening switches for vehicles and, more particularly, to opening switches having force sensors integrated with decorative cover assemblies.

BACKGROUND

Force sensing is oftentimes used in various vehicle applications. For example, U.S. Pat. No. 8,994,689 to Pandher discloses the use of capacitive sensors to control power windows, and US 2009/0065267 A1 to Sato discloses the use of electrostatic capacitive sensors along with strain sensors for an electronic button. However, capacitive sensors often require capacitive touch with a user's body or finger. It is a desirable alternative to provide force sensing or detection when a user is wearing a glove, for example. Further, it is desirable to provide certain functionalities such as opening and/or closing of various vehicle devices including windows, doors, and storage compartments, in a more seamless manner than traditional switches. The switches described herein can more simply integrate force sensing with these various vehicle functionalities, including backlighting and haptic feedback, to enhance the vehicle user's experience.

SUMMARY

An illustrative opening switch for a vehicle includes a decorative cover assembly having an inner surface, an outer surface, an anchor portion, and a deflection portion, wherein the deflection portion is configured to at least partially deflect relative to the anchor portion upon a contact from a user at the inner surface; a sensor housing region located adjacent the outer surface of the decorative cover assembly; and a microelectromechanical (MEMS) sensor mounted in the sensor housing region. When the contact from the user occurs at the deflection portion in the decorative cover assembly, a microdeflection occurs. The microdeflection has a microdeflection apex, and the microdeflection apex is spaced from other surfaces in the sensor housing region when the contact from the user occurs at the deflection portion in the decorative cover assembly. When the contact from the user occurs at the deflection portion in the decorative cover assembly, the MEMS sensor is configured to generate an output signal that is indicative of a force of the contact from the user.

In some embodiments, the output signal is indicative of a position of the microdeflection.

In some embodiments, a light emitting diode (LED) is configured to backlight the decorative cover assembly.

In some embodiments, a haptic actuator is configured to provide haptic feedback to the user after the contact from the user occurs at the deflection portion in the decorative cover assembly.

In some embodiments, a microcontroller is configured to receive the output signal from the microelectromechanical (MEMS) sensor, and the microcontroller is connected to a haptic driver that is configured to control the haptic actuator.

In some embodiments, the decorative cover assembly includes a skin layer at the inner surface and a substrate at the outer surface.

In some embodiments, the output signal is used to control opening of a door of the vehicle.

In some embodiments, a sensor pad is located between the microelectromechanical (MEMS) sensor and the outer surface of the decorative cover assembly.

In some embodiments, a second microelectromechanical (MEMS) sensor is configured to generate a second output signal and a third MEMS sensor is configured to generate a third output signal, and the first output signal, the second output signal, and the third output signal are used to triangulate a position of the microdeflection.

In some embodiments, the deflection portion includes at least a portion of a storage compartment door, and one or more of the first output signal, the second output signal, and the third output signal are used to control opening of the storage compartment door.

In some embodiments, the output signal is used to control opening and/or closing of a window of the vehicle.

In some embodiments, the deflection portion of the decorative cover assembly includes an opening segment and a closing segment.

In some embodiments, the microelectromechanical (MEMS) sensor is mounted on the outer surface at the closing segment.

In some embodiments, an intermediate angled segment connects the opening segment and the closing segment such that the microelectromechanical (MEMS) sensor is mounted between the outer surface at the closing segment and the outer surface at the opening segment. The opening segment, the intermediate angled segment, and the closing segment comprise three walls of the sensor housing region.

In some embodiments, the microelectromechanical (MEMS) sensor is preloaded with a baseline load such that the contact from the user on the closing segment is configured to generate a force that increases the baseline load, and wherein the contact from the user on the opening segment is configured to generate a force that decreases the baseline load.

It is contemplated that any number of the individual features of the above-described embodiments and of any other embodiments depicted in the drawings or description below can be combined in any combination to define an invention, except where features are incompatible.

BRIEF DESCRIPTION OF THE DRAWINGS

Illustrative embodiments will hereinafter be described in conjunction with the following figures, wherein like numerals denote like elements, and wherein.

DESCRIPTION OF ILLUSTRATIVE EMBODIMENTS

Described herein are embodiments of opening switches for use in various vehicle-based applications, such as vehicle storage compartments, vehicle doors, and vehicle windows. The opening switches integrate microelectromechanical (MEMS) force sensing with particular decorative covering assemblies, backlighting, and/or haptic feedback to provide a more aesthetic and user-friendly switch. The haptic feedback integration with the MEMS force sensing, in particular, can enhance the user's experience by making operation of less traditional looking switches more intuitive to the user. For example, the switches may be a hidden button or function activation that is integrated on a decorative surface in the vehicle. Given the hidden nature of the switches in some embodiments, the haptic feedback can provide tactile feedback to the user such that the user receives confirmation that the particular function (e.g., opening) is activated. Further, unlike typical capacitive-based sensing used in opening switches, the switch embodiments described herein can be operated with a gloved hand or other objects, if desired.

Figure 1:
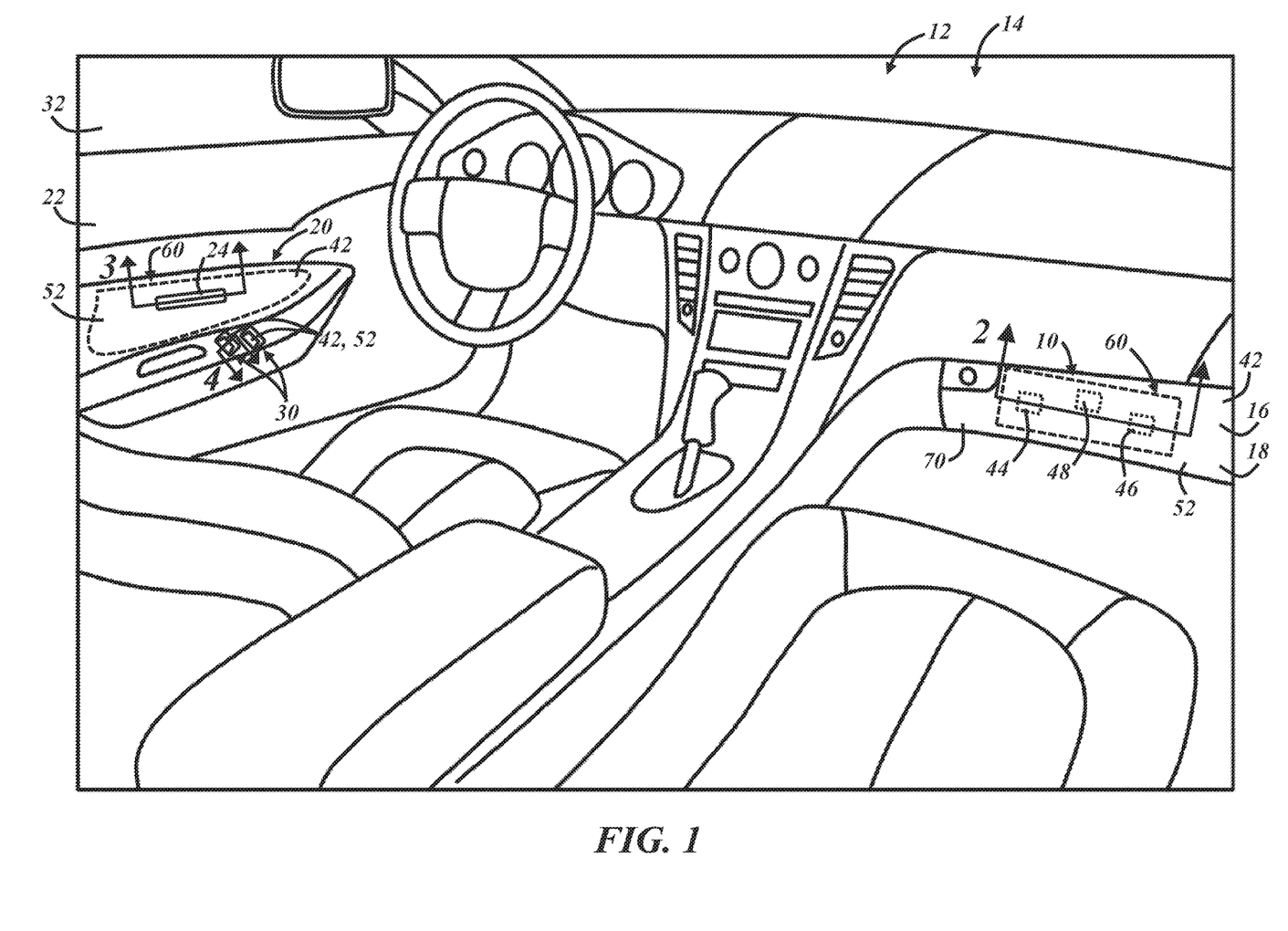
FIG. 1 is a perspective view of the interior of a vehicle passenger cabin equipped with various embodiments of opening switches.

FIG. 1 is a perspective view of various embodiments of opening switches 10, 20, 30 in an interior of a passenger cabin 12 of a vehicle 14. The opening switch 10 is used to operate a vehicle storage compartment 16, which is a glove box door 18 in this embodiment. The opening switch 20 is used to operate a vehicle door 22, or more particularly, a vehicle door handle 24 on an interior of the passenger cabin 12 or a vehicle door electronic release or e-release device. The opening switches 30 are used to operate one or more windows of the vehicle 14, such as the driver's side window 32, and the passenger side window (not shown). The opening switches 10, 20, 30 can be implemented in any vehicle-based application where one door, window, panel, etc. opens relative to another portion of the vehicle. For example, the storage compartment 16 can be a glove box as illustrated, or it may be another storage compartment in vehicle, such as a storage compartment within the center console, to cite one example. The switch may be integrated with the compartment itself, such as on the compartment door, or on an adjacent, or even remote, static surface. Further, various features of the opening switches 10, 20, 30 include application-specific attributes, but many features of one opening switch may be applicable to other implementations of an opening switch.

Figure 2:
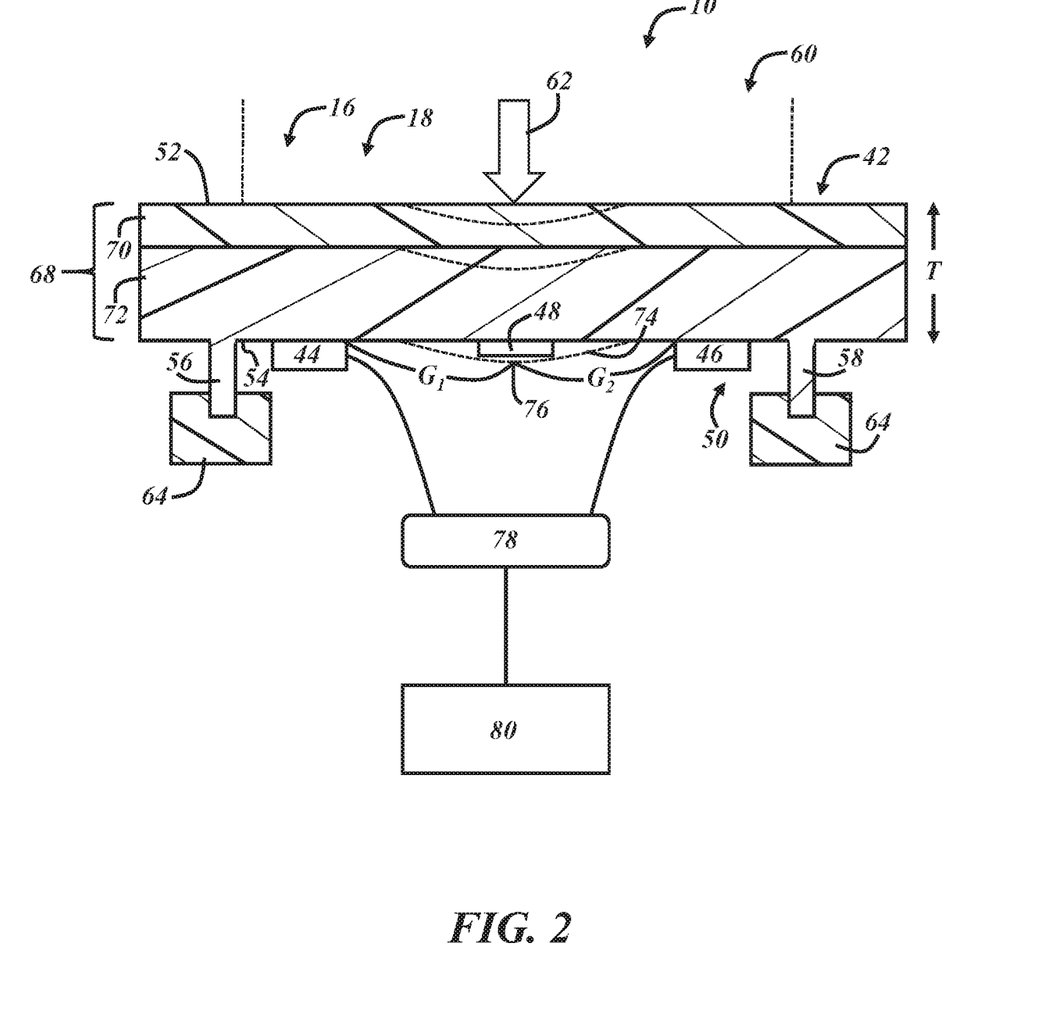
FIG. 2 is a schematic, cross-section view of an opening switch for a storage compartment, such as the storage compartment shown in the vehicle passenger cabin of FIG. 1.

FIG. 2 is a schematic, cross-section view of the storage compartment opening switch 10 which is used to open the glove box door 18. The switch 10 includes a decorative cover assembly 42 and three MEMS sensors 44, 46, 48. The MEMS sensors 44, 46, 48 are mounted in a sensor housing region 50. There may be more MEMS sensors than what is illustrated in the figures, or less, as described with the other opening switches 20, 30. The number of MEMS sensors may be dependent on the particular application. For example, when the switch is implemented on a larger panel area, such as the glove box door 18, it may be desirable to have more MEMS sensors, as more MEMS sensors can provide for a larger sensing area and/or higher resolution. Additionally, the number of MEMS sensors may be at least partially dependent on the sensitivity of the sensors and/or the material used for the decorative cover assembly 42. For example, a decorative cover assembly 42 made of a plastic material may be more deflective, and thereby more receptive to user contact, than another material such as chrome, aluminum, or another metal material, to cite a few examples.

The decorative cover assembly 42 includes an inner surface 52, an outer surface 54, one or more anchor portions 56, 58, and a deflection portion 60. The terms "inner" and "outer" are generally used to orient various vehicle components with respect to the user of the switch, which is toward the user in the interior passenger cabin 12 (i.e., "inner") or facing away from the user in the interior passenger cabin 12 (i.e., "outer") when the switches are implemented on the vehicle interior. When the switches are implemented on the vehicle exterior, inner is used to orient the components closer toward the user of the switch (closer to the vehicle exterior) or further away from the user of the switch (closer to the vehicle interior passenger cabin 12). FIG. 2 shows that the sensor housing region 50 is located adjacent the outer surface 54 of the decorative cover assembly 42. The inner surface 52 of the decorative cover assembly 42 faces the interior passenger cabin 12 of the vehicle 14, and the inner surface 52 can be referred to as the A-side.

The deflection portion 60, which is schematically marked with dotted lines in FIGS. 1 and 2, is configured to at least partially deflect relative to the anchor portions 56, 58 upon a contact from a user (represented by arrow 62) at the inner surface 52. The size and shape of the deflection portion 60 is dependent on a number of factors, including, but not limited to, the materials used for decorative cover assembly 42 and the position and structure of the anchor portions 56, 58. In some embodiments, such as when the anchor portion is located around the outer perimeter of the decorative assembly, the deflection portion 60 may make up the entire decorative cover assembly itself (e.g., the deflection portion could comprise the entire area of the glove box door 18 with the exception of an anchored outer perimeter). The anchor portions 56, 58 are mounted to, or otherwise integrated with (e.g., co-molded), another structural component 64 of the vehicle 14, which is only schematically illustrated in FIG. 2. For example, the structural component 64 may be an inner portion of the glove box door 18 such that the opening switch 10, including the sensor housing region 50, is located wholly within the glove box door.

In the embodiment of FIG. 2, the decorative cover assembly 42 includes a multi-layer structure 68 that is comprised of multiple layers of different materials that provide various, structural, functional, aesthetic, and/or tactile qualities. Depending on the implementation, the multi-layer structure 68 can include a skin layer 70 and a substrate 72. There may be more layers than what is illustrated in FIG. 2, or there could be less layers. For example, other interlayers may be included, such as a spacer, a foam layer, and/or one or more adhesive layers. Further, the layers may be different in configuration and/or composition from what is illustrated and described herein, as the multi-layer structure 68 described below is merely an example.

The skin layer 70 is the outermost layer of the decorative cover assembly 42 and includes the visible outer side or A-side along the outer surface 52 with an opposite side facing outward toward the substrate 72. The primary function of the skin layer 70 is to provide a resilient, long-lasting exposed surface within the vehicle with aesthetic appeal to occupants of the passenger cabin, including desirable visual characteristics such as color, shape, and texture. The skin layer 70 may thus include design features visible at the A-side or outer surface 52, such as an embossed pattern or a paint film in the desired color. The skin layer 70 may also at least partly provide the decorative cover assembly 42 with desired tactile characteristics in the likeness of furniture upholstery, such as a soft-touch or smooth feel. In some cases, the skin layer 70 is formed with synthetic materials configured with aesthetic characteristics imitating other more expensive materials such as leather. In yet other embodiments, the skin layer 70 is a natural material such as leather or wood veneer.

The substrate 72 is typically the most rigid of the illustrated layers of the multi-layer assembly 68 and thereby provides structural support for the overlying layer(s) at desired locations within the vehicle via attachment to other vehicle structures, such as structural component 64 via anchor portions 56, 58. As shown in FIG. 2, the anchor portions 56, 58 are integrally formed in the outer surface 54 of the substrate 72. However, it is possible for the anchor portions 56, 58 to be separate components that are attached to the substrate 72 or decorative cover assembly 42. Fiberglass-reinforced polypropylene having a thickness of 1.6 mm to 4 mm is one example of a suitable substrate 72, but various other types of materials and material combinations and/or different thickness ranges can be employed in a similar manner.

The switch 10, upon contact from a user as indicated via arrow 62, creates a microdeflection 74 in the deflection portion 60 (the microdeflection 74 is schematically represented in dotted lines). The microdeflection 74 includes a microdeflection apex 76. At the microdeflection apex 76, the deflection amplitude is the greatest, as this is the part of the deflection portion 60 where the force from the contact from the user 62 is the greatest or most concentrated. The size and shape of the microdeflection 74 and the microdeflection apex 74 will depend on a number of factors, including but not limited to, the applied force from the contact from the user, the mounting structure of the decorative cover assembly 42, and the resiliency of the materials used for the decorative cover assembly.

Unlike more traditional force sensing switches in vehicles, the with the present switches, sensing and actuation can occur when the microdeflection apex is spaced from other surfaces in the sensor housing region 50. The other surfaces depend on the structure of the sensor housing region 50, and may include a PCB, as detailed further below in other embodiments, the structural component 64, or a portion of the MEMS sensors 44, 46, 48, to cite a few examples. Advantageously, in some embodiments, this spacing occurs via an airgap G that exists between the microdeflection apex 76 and the MEMS sensors with the switch 10. In this particular embodiment of a switch 10, a first airgap $G_1$ is situated between the microdeflection apex 76 and the first MEMS sensor 44, and a second airgap $G_2$ is situated between the microdeflection apex 76 and the second MEMS sensor 46. Additionally, although not particularly shown in FIG. 2 because the third MEMS sensor extends back into the page, a third airgap is situated between the microdeflection apex 76 and the MEMS sensor 48. The airgaps G between the deflection apex 76 and the MEMS sensors 44, 46, 48 can provide a more robust sensing environment as compared to other embodiments without such airgaps. For example, this switch layout provides for indirect force sensing, which can be a more economical use of sensing resources. While direct sensing is possible, such as when the microdeflection occurs directly in-line with a sensor 44, the present embodiments allow for sensing and actuation to occur when the microdeflection apex is spaced from other surfaces in the sensor housing region 50. Further, the micro size of the MEMS sensors 44, 46, 48 (e.g., between 0.5 mm×0.5 mm×0.5 mm and 2 mm×2 mm×2 mm), can be beneficial in vehicle-based applications, where component space can be limited.

The MEMS sensors 44, 46, 48 are configured to generate an output signal that is indicative of the force of the contact from the user 62. Additionally, particularly with respect to the switch 10 shown in FIGS. 1 and 2, the output signal of the MEMS sensors 44, 46, 48 is also indicative of a position of the microdeflection 74 and/or the microdeflection apex 76. The MEMS sensor 44, 46, 48 is advantageously a discrete force-based sensor or strain gauge that is capable of indirect force sensing. In one embodiment, the MEMS sensor 44, 46, 48 is a force sensor available from NEXTINPUT. The sensors 44, 46, 48 can be mounted to a PCB 78, which is schematically represented in FIG. 2. In some embodiments, the PCB 78 may include its own microcontroller, as detailed more fully below, that triangulates the output signals of the sensors 44, 46, 48. The triangulation of the first output signal from the MEMS sensor 44, the second output signal from the MEMS sensor 46, and the third output signal from the MEMS sensor 48, provides the ability to identify the coordinates of the contact 62, and can provide a better determination of the applied force of the contact 62. In some embodiments, this type of output signal processing can be accomplished with more or less sensors than what is particularly illustrated in FIGS. 1 and 2. With the position and force information, function activation is possible that is usually accomplished by mechanical buttons. In some implementations, some or all of the processing may be accomplished with another, more remote processing device, such as a body control module 80. This will depend on various factors such as the sensor output signal, which may be advantageously treated by a microcontroller locally at the PCB 78, as certain protocols may only be able to travel particular distances.

The switch 10 is advantageously used with full panel style activation of a function, such as with opening the storage compartment 16, or more particularly opening the glove box door 18. It is possible, as detailed further below, to integrate haptic feedback and/or backlighting in this embodiment, as well as other embodiments, to provide a more aesthetically pleasing and user-friendly tactile experience.

Figures 3, 4:
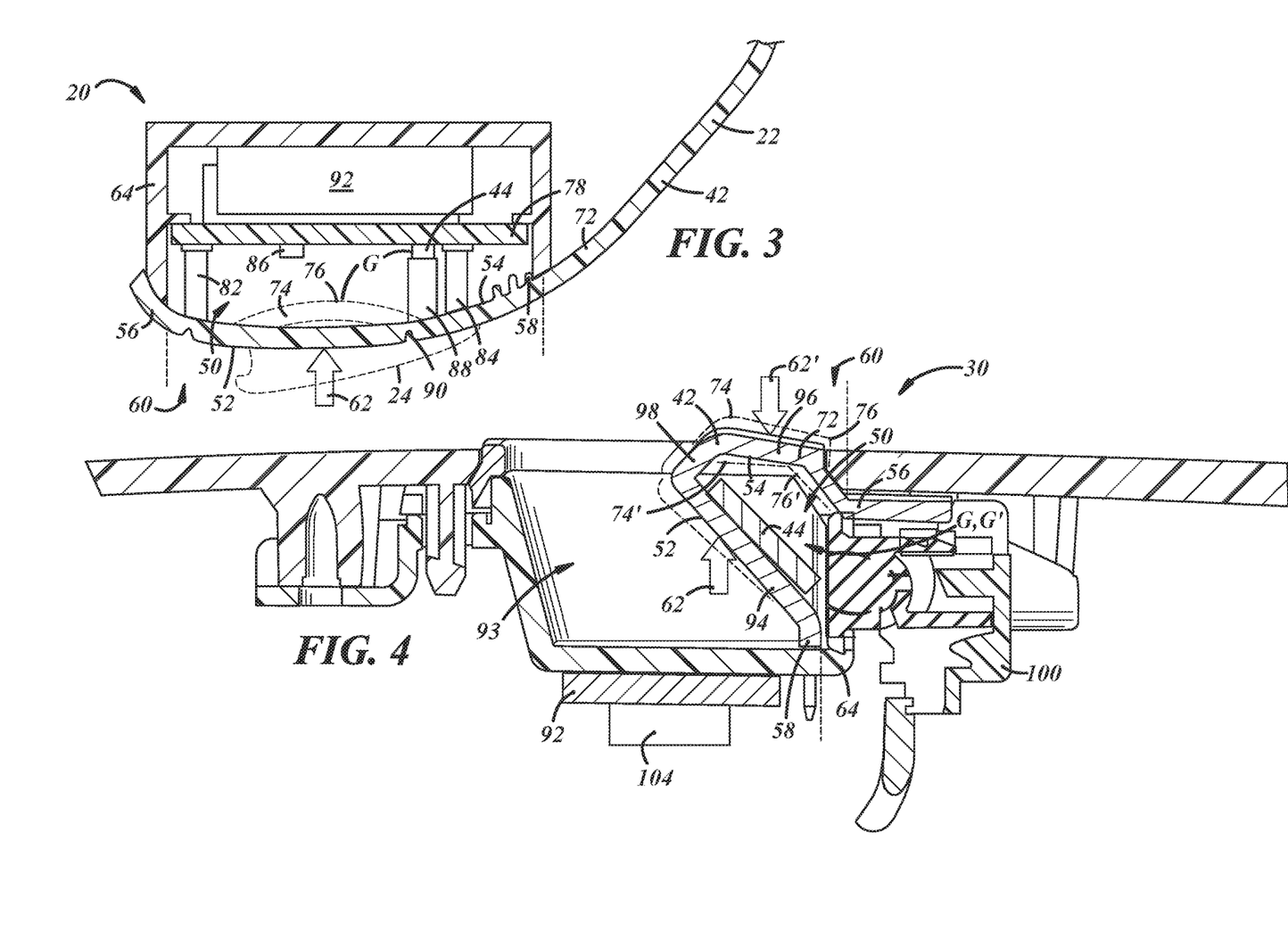
FIG. 3 is a schematic, cross-section view of an opening switch for a door, such as the door shown in the vehicle passenger cabin of FIG. 1.
FIG. 4 is a schematic, cross-section view of an opening switch for a window, such as the driver door window shown in the vehicle passenger cabin of FIG. 1.

FIG. 3 illustrates an opening switch 20 that can be used to facilitate opening of a vehicle door 22. Opening a door 22 of the vehicle 14 may include fully actuating opening of the door 22 itself, or full or partial ejection of a door handle 24 so that a user can then open the door in a more typical, manual fashion. The opening switch 20 may be implemented in the interior passenger cabin 12 of the vehicle, which is what is presently described, or on the exterior of the vehicle 14. As described above, if implemented on the exterior, those skilled in the art will understand that the terms "inner" and "outer" are in a sense reversed compared to the other interior-based embodiments, such that inner will be closest to the user operating the vehicle door 22 from the outside, and outer will be further from the user operating the vehicle door 22 from the outside. Additionally, the decorative cover assembly 42 will likely differ depending on whether the switch 20 is implemented on the vehicle interior or vehicle exterior. For example, an exterior switch 20 may have an aluminum panel or the like used for the decorative cover assembly 42, whereas an interior switch 20 could have a multilayer structure 68 such as that shown in FIG. 2, or just a single substrate plastic layer 72. Other materials and configurations are certainly possible.

In the embodiment of FIG. 3, the MEMS sensor 44 is attached to the PCB 78, and as shown, an airgap G exists between the microdeflection apex 76 of the microdeflection 74 and the MEMS sensor 44. Again, given the material construction and overall mounting configuration of the decorative assembly 42, the size and shape of the microdeflection apex 76 will likely vary from what is schematically illustrated in the figures. Nonetheless, the microdeflection apex 76 occurs where there is the greatest amount of displacement in the decorative cover assembly 42 resulting from the force of the contact from the user 62. If the displacement is generally uniform, the microdeflection apex 76 can be considered the point along the microdeflection 74 that is furthest from the MEMS sensor 44. In some embodiments, features such as the light boxes 82, 84, which can help selectively transmit light from a light emitting diode (LED) 86 may be located in and around the MEMS sensor 44 and/or the microdeflection 74; however, there is at least still a partial airgap between the sensor 44 and the microdeflection apex 76 such that indirect sensing of the contact from the user 62 is facilitated.

The MEMS sensor 44 is situated between the PCB 78 and a sensor pad 88. The sensor pad 88 is situated directly between the sensor 44 and the outer surface 54 of the decorative cover assembly 42. In this embodiment, the sensor pad 88 is made of a compliant material, such as rubber. It provides a mechanical means of transferring the input force from the user contact 62 at the inner surface 52 to the MEMS sensor 44. Since it is compliant, it can compensate, to a degree, for the variation from part to part, keeping contact through a number of elements in the system, including the MEMS sensor 44, the sensor pad 88, and the decorative cover assembly 42, which may include features such as the bezel 90.

Output from the MEMS sensor 44 can be used to facilitate a number of functionalities, including but not limited to opening of the door 22, ejection of the handle 24, backlighting from one or more LEDs 86, and/or haptic feedback via an actuator 92. As described above and detailed further below, the MEMS sensor 44 can output a signal to a microcontroller to help facilitate these various functionalities. In one embodiment, the output signal from the MEMS sensor 44 is used to control illumination of the LED 86. This can backlight the decorative cover assembly 42 to provide a more aesthetically pleasing switch assembly 20. Alternatively or additionally, the output signal from the MEMS sensor 44 is used to trigger haptic feedback via a haptic actuator 92. The haptic actuator 92 may facilitate movement of the structural component 64, which in this embodiment, defines the sensor housing region 50, such that the deflection portion 60 of the decorative cover assembly 42 moves opposite to the force of the contact from the user 62. This can give the user tactile feedback that the action (e.g., door 22 and/or handle 24 opening) is occurring. In some embodiments, there may be no haptic feedback, and the actuator 92 may be used to open the door 22 and/or handle 24. In yet other embodiments, haptic feedback may be provided by the actuator 92 and opening of the door 22 and/or the handle 24 may be accomplished via another vehicle device or component (e.g., the body control module 80). Other operational schemes are certainly possible.

FIG. 4 is a cross-section, schematic view of the window opening switch 30. The opening switch 30, in this embodiment, includes a decorative cover assembly 42 that comprises a chrome substrate 72. Other materials and configurations, however, are certainly possible. Unlike the switches 10, 20, the opening switch 30 is configured to open and/or close the window 32. This configuration can be used in other switch implementations, depending on the desired functionalities. To facilitate window closing, a user can reach into a finger recess 93 and exert a force upward on the switch 30. In this embodiment, the deflection portion 60 of the decorative cover assembly 42 is subdivided into two or more, or advantageously three different segments: a closing segment 94, an opening segment 96, and an intermediate angled segment 98. Contact from the user 62 that occurs on the closing segment 94 can trigger closing of the window 32, whereas contact from the user 62' that occurs on the opening segment 96 can trigger opening of the window 32. Contact from the user at the intermediate angled segment 98 may facilitate opening and/or closing, depending on the applied force by the user. At the intermediate angled segment 98, the decorative cover assembly 42 may be thinner than at the segments 94, 96 in order to promote deflection. The closing segment 94, the opening segment 96, and the intermediate angled segment 98 together comprise three walls and generally define the sensor housing region. Additionally, with this configuration, the closing segment 94 is located wholly within the finger recess 93.

Given the structure of the decorative cover assembly 42 and the segments 94, 96, 98, when contact from the user 62 occurs on the closing segment 94 to pull the switch 30 up and close the window 32, the microdeflection 74 generally occurs throughout the deflection portion 60, and leads to a microdeflection apex 76 that is located on the opposite segment or closing segment 96. When contact from the user 62' occurs on the opening segment 96 to push the switch 30 down and open the window 32, the microdeflection 74 also generally occurs throughout the entirety of the deflection portion 60, and leads to a microdeflection apex 76 that is also located on the opening segment 96, as that portion of the microdeflection 74 is furthest from the sensor 44 along the displacement of the deflection portion 60. This leads to a similarly situated airgap G, G' whether user contact on the switch 30 is on the closing segment 94 (contact or force 62) or on the opening segment 96 (contact or force 62').

In order to accommodate the dual opening/closing or push/pull functionality, the MEMS sensor 44 of the switch 30 is advantageously preloaded and mounted to the outer surface 54 of the decorative cover assembly 42 at the closing segment 94. The MEMS sensor 44 is preloaded with a baseline load such that the contact from the user 62 on the closing segment 94 is configured to generate a force that increases the baseline load, whereas contact from the user 62' on the opening segment 96 is configured to generate a force that decreases the baseline load. In one particular example, the baseline load is 5 N, and contact from the user 62 on the closing segment 94 that increases from 5 N to 8 N or more will output a signal and/or trigger the opening of window 32. Continuing with this example, with a baseline load of 5 N, contact from the user 62' on the opening segment 96 that decreases from 5 N to 3 N or less will output a signal and/or trigger the closing of window 32. Advantageously, the percentage of decrease from the baseline load to trigger opening is less than the percentage of increase from the baseline load to trigger closing, but other operational schemes and preloading methodologies are certainly possible. In one other example, there could be two different thresholds for contact with the closing segment 94 or contact with the opening segment 96. The two different thresholds can be used to facilitate automatic opening and/or closing. Thus, satisfying one threshold would trigger manual opening or closing, and then satisfying both thresholds would trigger automatic opening or closing. This embodiment, in essence, implements four features into one sensor 44 (manual/automatic opening and manual/automatic closing). Furthermore, the present sensor integration is also able to differentiate with only one sensor 44 for either the left or right window; for instance, by positioning the sensor such that it has a different signal output signature based on when the microdeflection apex 76 occurs, which enables the switch system to differentiate if a user is trying to open or close the left or the right window. Additionally, it should be noted that a preloaded MEMS sensor could be implemented in other switch embodiments, besides just the window switch 30.

Figure 5:
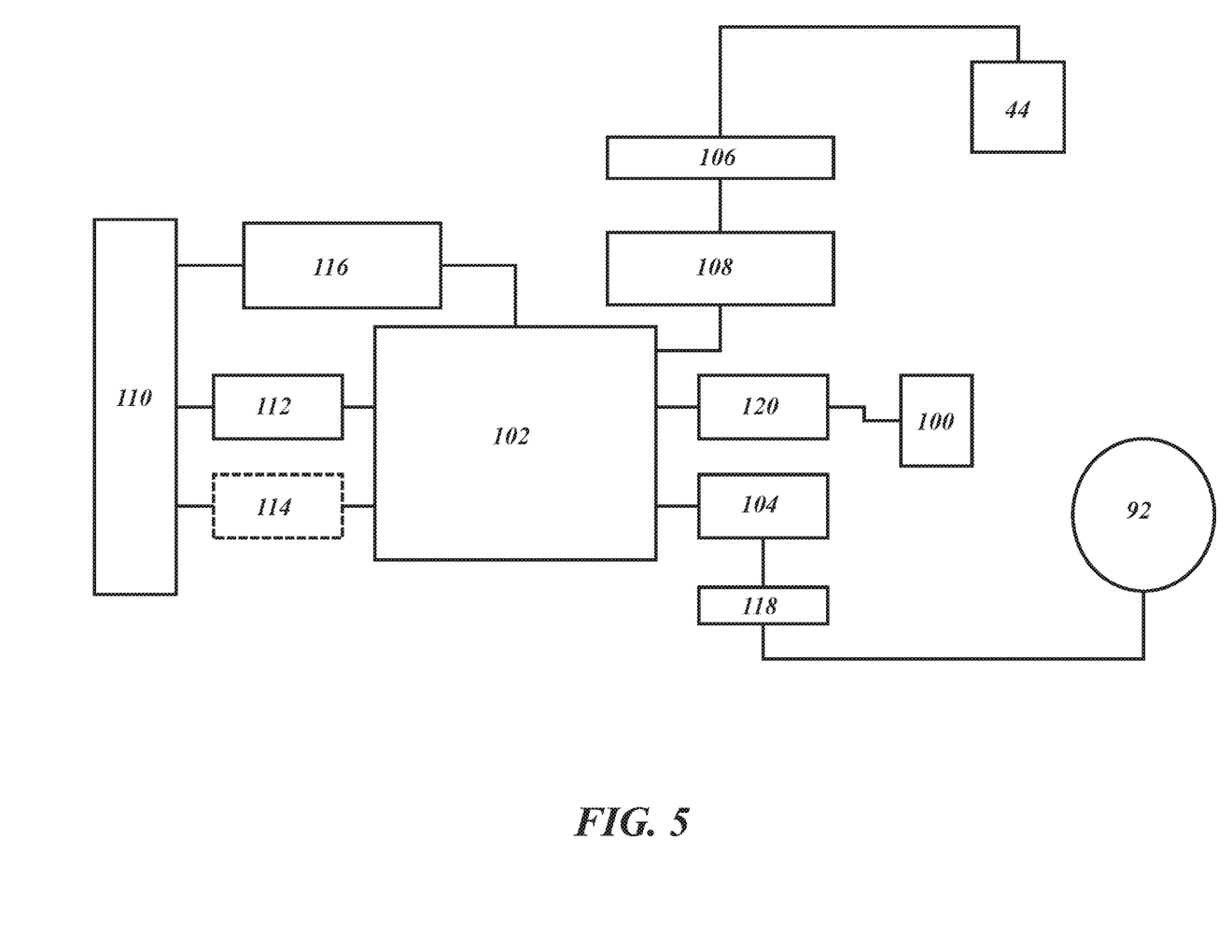
FIG. 5 is an example circuit schematic that can be used in conjunction with one or more opening switches, such as the opening switch for the window illustrated in FIG. 4.

In the FIG. 4 embodiment, as with the FIG. 3 embodiment, the output signal from the MEMS sensor 44 can be used to facilitate a number of functionalities, including but not limited to, opening the window 32, closing the window 32, backlighting from one or more LEDs located in an LED backlight assembly 100, and/or providing haptic feedback via an actuator 92 and/or a haptic driver 104. FIG. 5 schematically illustrates how the FIG. 4 switch 30 may be configured, but one or more aspects of the FIG. 5 schematic can be applied to other switch embodiments, such as the switches 10, 20. Moreover, the FIG. 5 schematic is just an example where a microcontroller 102 is used to coordinate processing; however, in other implementations, the microcontroller may be replaced with a combination of various other circuit components, such as an output driver, one or more resistors and capacitors, etc.

In FIG. 5, the microcontroller 102 receives the output signal from the MEMS sensor 44 (or in other embodiments, more than one MEMS sensor), via a connector 106 and a discrete, touch sensor interface 108. In embodiments having more than one MEMS sensor, such as the switch 10 with MEMS sensors 44, 46, 48, a software program executable via the microcontroller 102 can triangulate the output of the sensors 44, 46, 48 to identify the position or coordinates of the contact 62 along with a measurement of the force of the contact 62. The microcontroller 102 may be able to communicate with other vehicle components, such as the window 32, via a vehicle connector 110 and a LIN bus 112 and/or optional CAN bus 114. A power supply 116 may be provided to power the microcontroller 102, or the microcontroller 102 may receive power via a separate vehicle source such as a vehicle battery. As described above, the signal output from the sensor 44 can be used to control a haptic actuator 92 and/or an LED backlight assembly 100. With the haptic actuator 92, a connector 118 can be used between the haptics driver 104 and the actuator. With the LED backlight assembly 100, an LED driver 120 may be used between the microcontroller 102 and the backlight assembly. If powering an LED at a number of different window switches 30 (e.g., one for each vehicle window), separate outputs can be used between the LED driver 120 and each LED 86 or each LED backlight assembly 100. As mentioned, other configurations, circuit components, etc. are possible, and will depend on the desired implementation.

It is to be understood that the foregoing is a description of one or more embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "e.g.," "for example," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. An opening switch for a vehicle, comprising:
a decorative cover assembly having an inner surface, an outer surface, an anchor portion, and a deflection portion, wherein the deflection portion is configured to at least partially deflect relative to the anchor portion upon a contact from a user at the inner surface;
a sensor housing region located adjacent the outer surface of the decorative cover assembly; and
a first microelectromechanical (MEMS) sensor mounted in the sensor housing region, a second MEMS sensor, and a third MEMS sensor,
wherein, when the contact from the user occurs at the deflection portion in the decorative cover assembly, a microdeflection occurs,
wherein the microdeflection has a microdeflection apex, and the microdeflection apex is spaced from other surfaces in the sensor housing region when the contact from the user occurs at the deflection portion in the decorative cover assembly, and
wherein, when the contact from the user occurs at the deflection portion in the decorative cover assembly, the first MEMS sensor is configured to generate a first output signal that is indicative of a force of the contact from the user, the second MEMS sensor is configured to generate a second output signal, and the third MEMS sensor is configured to generate a third output signal, and wherein the first output signal, the second output signal, and the third output signal are used to triangulate a position of the microdeflection.

2. The opening switch of claim 1, wherein the first output signal is indicative of a position of the microdeflection.

3. The opening switch of claim 1, wherein a light emitting diode (LED) is configured to backlight the decorative cover assembly.

4. The opening switch of claim 1, wherein a haptic actuator is configured to provide haptic feedback to the user after the contact from the user occurs at the deflection portion in the decorative cover assembly.

5. The opening switch of claim 4, wherein a microcontroller is configured to receive the first output signal from the first microelectromechanical (MEMS) sensor, and wherein the microcontroller is connected to a haptic driver that is configured to control the haptic actuator.

6. The opening switch of claim 1, wherein the decorative cover assembly includes a skin layer at the inner surface and a substrate at the outer surface.

7. The opening switch of claim 1, wherein the output signal is used to control opening of a door of the vehicle.

8. The opening switch of claim 1, wherein a sensor pad is located between the first MEMS sensor and the outer surface of the decorative cover assembly.

9. The opening switch of claim 1, wherein the deflection portion includes at least a portion of a storage compartment door, and one or more of the first output signal, the second output signal, and the third output signal are used to control opening of the storage compartment door.

10. The opening switch of claim 1, wherein the output signal is used to control opening and/or closing of a window of the vehicle.

11. The opening switch of claim 10, wherein the deflection portion of the decorative cover assembly includes an opening segment and a closing segment.

12. The opening switch of claim 11, wherein one or more of the first MEMS sensor, the second MEMS sensor, and the third MEMS sensor are mounted on the outer surface at the closing segment.

13. The opening switch of claim 11, wherein the MEMS sensor is preloaded with a baseline load such that the contact from the user on the closing segment is configured to generate a force that increases the baseline load, and wherein the contact from the user on the opening segment is configured to generate a force that decreases the baseline load.

14. An opening switch for a vehicle, comprising:
- a decorative cover assembly having an inner surface, an outer surface, an anchor portion, and a deflection portion, wherein the deflection portion is configured to at least partially deflect relative to the anchor portion upon a contact from a user at the inner surface;
- a sensor housing region located adjacent the outer surface of the decorative cover assembly; and
- a microelectromechanical (MEMS) sensor mounted in the sensor housing region,
- wherein, when the contact from the user occurs at the deflection portion in the decorative cover assembly, a microdeflection occurs,
- wherein the microdeflection has a microdeflection apex, and the microdeflection apex is spaced from other surfaces in the sensor housing region when the contact from the user occurs at the deflection portion in the decorative cover assembly, and
- wherein, when the contact from the user occurs at the deflection portion in the decorative cover assembly, the MEMS sensor is configured to generate an output signal that is indicative of a force of the contact from the user, wherein the output signal is used to control opening and/or closing of a window of the vehicle, wherein the deflection portion of the decorative cover assembly includes an opening segment and a closing segment, wherein the MEMS sensor is mounted on the outer surface at the closing segment, and wherein an intermediate angled segment connects the opening segment and the closing segment such that the MEMS sensor is mounted between the outer surface at the closing segment and the outer surface at the opening segment, and wherein the opening segment, the intermediate angled segment, and the closing segment comprise three walls of the sensor housing region.

* * * * *